United States Patent
Sonsky

(10) Patent No.: US 9,793,348 B2
(45) Date of Patent: Oct. 17, 2017

(54) METHOD OF MANUFACTURING A SEMICONDUCTOR DEVICE WITH AN ISOLATION REGION AND A DEVICE MANUFACTURED BY THE METHOD

(71) Applicant: NXP B.V., Eindhoven (NL)

(72) Inventor: Jan Sonsky, Louvain (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/946,064

(22) Filed: Nov. 19, 2015

(65) Prior Publication Data
US 2016/0079282 A1 Mar. 17, 2016

Related U.S. Application Data

(62) Division of application No. 12/065,622, filed as application No. PCT/IB2006/053118 on Sep. 5, 2006, now Pat. No. 9,224,634.

(30) Foreign Application Priority Data

Sep. 6, 2005 (EP) .................... 05108164

(51) Int. Cl.
H01L 21/76 (2006.01)
H01L 29/06 (2006.01)
H01L 21/762 (2006.01)
H01L 27/12 (2006.01)
H01L 29/267 (2006.01)

(52) U.S. Cl.
CPC ........ *H01L 29/0649* (2013.01); *H01L 21/762* (2013.01); *H01L 21/76224* (2013.01); *H01L 21/76264* (2013.01); *H01L 21/76283* (2013.01); *H01L 27/1207* (2013.01); *H01L 29/267* (2013.01)

(58) Field of Classification Search
None
See application file for complete search history.

(56) References Cited

U.S. PATENT DOCUMENTS

| | | | |
|---|---|---|---|
| 5,963,789 A | 10/1999 | Tsuchiaki | |
| 6,383,943 B1 | 5/2002 | Chen | |
| 6,537,894 B2 * | 3/2003 | Skotnicki | H01L 21/76264 257/E21.564 |
| 2003/0057487 A1 | 3/2003 | Yamada et al. | |
| 2004/0084726 A1 | 5/2004 | Kim et al. | |
| 2005/0020085 A1 | 1/2005 | Lee et al. | |

(Continued)

FOREIGN PATENT DOCUMENTS

EP 0 812 016 A1 12/1997
EP 1 480 266 A2 11/2004

OTHER PUBLICATIONS

International Search Report for Int'l. Patent Appln. No. PCT/IB2006/053118 (Feb. 20, 2007).

*Primary Examiner* — Fei Fei Yeung Lopez

(57) ABSTRACT

A method of manufacturing a semiconductor device includes forming trench isolation structures, exposing some of the trench isolation structures 28 to leave others 30 masked, and then selectively etching a buried layer to form a cavity 32 under an active device region 34. The active device region 34 is supported by support regions in the exposed trenches 28. The buried layer may be a SiGe layer on a Si substrate.

10 Claims, 17 Drawing Sheets

(56) References Cited

U.S. PATENT DOCUMENTS

2005/0255678 A1* 11/2005 Kato .................. H01L 21/76272
　　　　　　　　　　　　　　　　　　　　　　　438/478
2006/0022269 A1* 2/2006 Kato .................. H01L 21/76283
　　　　　　　　　　　　　　　　　　　　　　　257/347

* cited by examiner (along B-B line)

(along C-C line)

METHOD OF MANUFACTURING A SEMICONDUCTOR DEVICE WITH AN ISOLATION REGION AND A DEVICE MANUFACTURED BY THE METHOD

CROSS-REFERENCE TO RELATED APPLICATIONS

This application is a division of co-pending application Ser. No. 12/065,622, filed on Sep. 5, 2006, which is the national stage of international patent application no. PCT/IB2006/053118, filed on Sep. 5, 2006, which claims priority under 35 U.S.C. §119 of European patent application no. 05108164.4, filed on Sep. 5, 2005, the contents of which are incorporated by reference herein The invention relates to a method for manufacturing a semiconductor with an isolated region, as well as to a semiconductor device as manufactured by such a method and in particular but not exclusively to a method of isolating a region of a semiconductor device that can be integrated into a standard CMOS process and to a corresponding device.

There is a general desire to isolate separate devices from one another on a single semiconductor substrate.

A particular example of this need is where it is desired to integrate high power and/or high voltage devices with logic or analog circuits. Traditionally, such power integrated circuits use buried layers or multiple well implantations (vertical isolation) in combination with shallow trench isolation (STI) structures or deep trench isolation (DTI) structures.

Such devices suffer from parasitic effects such as bipolar transistor switching, latch-up and substrate minority injection. Techniques are available for reducing, though not eliminating, such parasitic effects but these generally result in a reduced device performance.

In some cases, such parasitics should be wholly removed to guarantee reliable functionality, especially in devices for harsh working environments. Such devices may use silicon-on-insulator (SOI) processes. A typical silicon on insulator process may use a p-type substrate, a buried oxide (BOX) layer acting as insulator extending over the whole of the top surface of the substrate, and a semiconductor layer over the buried oxide layer, typically of silicon. Devices in the silicon layer can be separated from one another by a DTI structure.

However, certain parameters of the logic devices such as parasitic capacitance and electrostatic discharge protection are affected by the buried oxide layer, so conventional CMOS processes require some adjustment. This adds to the expense, since the devices cannot simply be put through existing conventional CMOS processing lines.

An advanced example of such a SOI process is the Philips semiconductor process known as the Advanced Bipolar CMOS DMOS (ABCD) process which allows the fabrication of bipolar, CMOS and DMOS processes on a single substrate. The process is a silicon on insulator process on a buried oxide layer.

A specific prior process is described in US2005/0020085 (Lee and Hsu). In this approach, an epitaxial SiGe layer is grown on a Si substrate, followed by an epitaxial thin top layer of Si. A complex sequence of processing steps then follows. Gate dielectric and polysilicon are deposited. Photoresist is deposited and patterned a first set of STI trenches are etched extending through the SiGe layer. Next, a small region of the SiGe layer adjacent to the trenches are etched away. The trenches are then filled with insulator leaving the small unetched regions of the SiGe layer unfilled.

Next, a further photoresist layer is deposited and patterned. The second patterning step leaves exposed the first STI trenches and a small area around the trenches, above the small region of the SiGe layer that has been etched away, as well as exposing the surface at other locations. Etching is then carried out to etch through the layers above the small regions of the SiGe layer that were etched away as well as to form second STI trenches. The remainder of the SiGe layer between the first trenches is then etched away. The upper layers are said to be supported by oxide plugs, though the text does not make clear how and when these are formed. The trenches filled with insulator.

The method is incompletely described, in that the formation of the oxide plugs is not described. Thus, any implementation of the method needs to be even more complicated than the process steps described above.

This process has a number of disadvantages. The need to form two patterns, just to form the first and second STI trenches and the multiple processing steps after each of the patterning steps means that the process is time consuming and complicated, and hence expensive. Secondly, the process is susceptible to process variation, for example the second trenches not being the same depth as the first, and thirdly the process requires special design rules which would further increase the cost and complexity.

Another prior proposal is presented in U.S. Pat. No. 6,537,894. In this approach, again an Si substrate, SiGe layer and then an Si layer are sequentially formed. As in US2005/0020085, two trench etch steps are required in U.S. Pat. No. 6,537,894. Firstly, a hard mask of SiN is deposited to define active regions. Then, a photolithography mask is used to expose small region at the edges of the active regions. These are etched through to form trenches, which are then filled with dielectric which form supports. The photolithography mask is then removed, and the active regions defined by an etch using the hard SiN mask. The dielectric supports remain.

This approach is much simpler than that described in US2005/0020085. However, the sidewalls of the regions are exposed during the formation of the supports, and can be damaged. This can be critical for very small devices.

Moreover, none of these approaches are compatible with the Philips ABCD process.

Accordingly there is a need for an alternative process for providing complete isolation of one region, which may be used for an isolated power semiconductor device, on the same substrate as other regions compatible with low power logic or control circuits.

According to the invention there is provided a method of manufacturing a semiconductor device including at least one isolated active region, comprising:

providing a substrate of a first semiconductor material;

depositing a buried layer of a second semiconductor material on the substrate;

depositing a device layer of a third semiconductor material on the second semiconductor material;

forming a plurality of trench isolation structures spaced laterally across the device layer, the trench isolation structures comprising trenches including support insulator partially filling the trench but not completely filling the trench to expose at least part of the buried layer; and selectively etching the buried layer through the part of the trench not including support insulator to remove the buried layer where exposed from under at least one isolated region of the device layer leaving the support insulator.

The step of selectively etching may form at least one cavity leaving a plurality of isolation regions above cavities supported only by the at least one support structure.

Unlike the approach of US2005/0020085, the trenches are partially filled to provide a support but not completely to allow etching through the trench. In US2005/0020085, instead a first set of trenches is etched and then filled in such a fashion that it is not possible to etch away the buried layer through the trench. This is solved in US2005/0020085 by etching additional trenches to access the buried layer, so two trench etch steps are required.

This is avoided in the partial fill approach of the present invention.

In embodiments, the partially filled trench may be provided either by providing insulator only along part of the length of the trench or by providing insulator on the sidewalls of the trench leaving the buried layer accessible through a gap in the insulator on the sidewalls.

In particular, the step of forming a plurality of trench isolation structures may include providing a mask over at least one trench isolation structure to define at least one masked trench region leaving at least one trench isolation structure exposed as at least one exposed trench region; and etching at least one exposed trench region to remove the trench-filling insulator from the isolation trench of the at least one exposed trench region to expose the buried layer within the at least one exposed trench region.

The process is relatively insensitive to process variation, and does not cause significant damage to the sidewalls of the inactive regions. Further, the process is relatively straightforward.

In preferred embodiments, in the step of selectively etching the buried layer the masked trench isolation protects the buried layer under at least one active region of the device layer to form a substrate-connected active region of the device layer.

The substrate connected active region is not over a buried oxide layer and can be used to form control or logic circuitry, typically including multiple devices. Since the region is not over buried oxide, it is connected to the substrate in the same way as a conventional CMOS process and conventional processing may be used. The isolated active region may be used, in preferred embodiments, for high power and/or high voltage semiconductor components, for example as individual output transistors. The power or voltage will depend on the application, but may, for example, include power output transistors with output voltages from a modest 3V through at least 30V or 100 up to 1000V or even more.

In particular, the first and third semiconductor materials may be the same. In embodiments the first and third semiconductor materials are silicon and the second semiconductor material is silicon germanium.

In embodiments, in the step of forming a plurality of trench isolation structures the isolation structures are shallow trench isolation structures that do not extend as deep as the buried layer. In this case, the step of etching the exposed trench isolation structures may preferably include removing the trench-filling insulator from the isolation trenches of the exposed trench isolation structures, and then carrying out an anisotropic etch in the exposed trenches to deepen the exposed trenches so that they extend to the buried layer within the exposed isolation trenches forming a deep trench isolation structure.

In this way, both shallow and deep trenches may be formed, the deep trenches providing total isolation and the shallow trenches being used for other purposes, for example to separate logic or control transistors or as part of the transistor itself.

For example, a field effect transistor may be provided isolated by the deep trench isolation structure having a source diffusion of first conductivity type in the active layer, a body adjacent to the source diffusion of a second conductivity type opposite to the first conductivity type, a drain region adjacent of first conductivity type adjacent to the body, and a drain diffusion of first conductivity type and more highly doped than the drain region contacting the drain region.

The device may include a plurality of shallow trench isolation structures extending longitudinally in the drain region from the body region towards the drain diffusion, the plurality of shallow trench isolation structures being spaced laterally across the drain region. The shallow trench isolation structures may act as dielectric reduced surface field (RESURF) structures to improve the characteristics of the device.

In embodiments the method may include, after the step of selectively etching the second semiconductor material to form the cavity, the step of depositing a thin layer of insulator on the sidewalls of the exposed trench but not in the cavity, and etching the cavity to increase the thickness of the cavity before the step of filling the cavity.

This provides a thicker local buried oxide layer which improves device isolation and in particular can reduce parasitic capacitance. Such a step is not included in the prior art processes mentioned above, and indeed would not appear to be compatible with such processes.

The shape of the mask used to define the trench isolation structures is also significant.

Preferably, the step of forming a plurality of trench isolation structures forms an isolation trench structure in a surrounding region, the isolation trench extending around an isolated active region, and the step of forming a mask forms a mask having a plurality of masking regions extending from the isolated active region over the isolation trench structure to the surrounding region. In this way the step of etching the exposed trench isolation structures may form a plurality of support structures in corresponding to the masking regions in the exposed trench.

In an embodiment, the mask may be formed in the shape of a cross, centred over the isolated active region and extending over the isolation trenches to the surrounding region.

Alternatively, the mask may have a mask region extending from the surrounding region over the isolation trench to the isolated active region over a plurality of corners of the active region.

In embodiments the step of forming a plurality of trench isolation structures includes: carrying out a selective etch of the buried layer through the trench to create a notch and depositing an insulating layer on the sidewalls of the trench except on the notch to leave the buried layer exposed through the notch.

In this way, the selective etch need only be carried out for long enough to create the notch. This reduces the processing difficulty of this step and allows for more relaxed processing parameters, improving yield.

In embodiments, the buried layer is patterned and the trenches are formed to define an active region surrounded by trenches with the buried layer being present at only part of the periphery of the active region so that the step of forming the notch forms the notch at only part of the periphery of the active region so that forming the insulating layer forms the insulating layer at the level of the buried layer extending around part but not all of the periphery of the active region.

The invention also relates to a device made by the method.

In another aspect of the invention there is provided a semiconductor device, comprising:

a semiconductor substrate;

a buried insulating layer over a part of the semiconductor substrate;

a buried semiconductor layer of different material to the substrate over the remainder of the semiconductor substrate;

a device layer over the buried insulating layer and buried semiconductor layer;

a plurality of trench isolation structures filled with insulator extending through the full thickness of the device layer to define at least one insulated active device region in the device layer surrounded by a trench isolation structure and above the buried insulating layer, the insulated active device region being insulated from the substrate by the buried insulating layer and the trench isolation structure; and at least one substrate-connected device region in the device layer connected to the substrate through buried semiconductor layer.

For a better understanding of the invention, embodiments will now be described, purely by way of example, with reference to the accompanying drawings in which.

Figure 1:
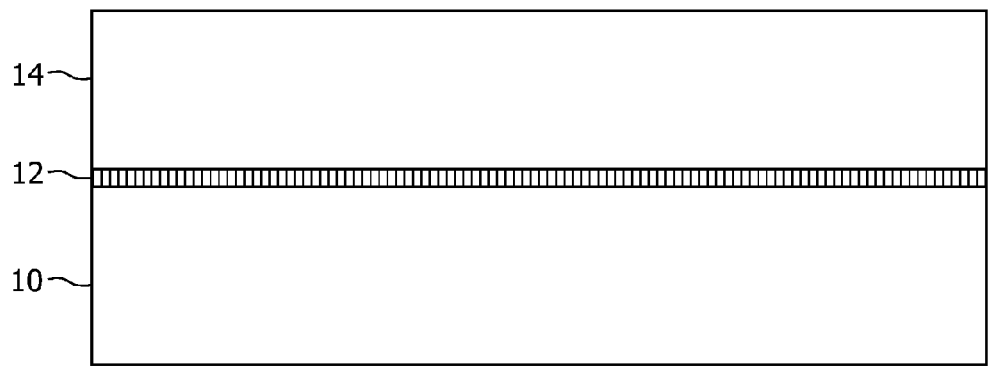
FIGS. 1 to 7 illustrate side views of the steps of a first method according to an embodiment of the invention and a resulting device according to the invention.

Like or corresponding components are given the same reference numerals in the different figures. The drawings are not to scale and the vertical direction in particular is expanded for greater clarity. Insulating regions are shown with a dot pattern—the density of dots in nitride regions is higher than that used for oxide regions; SiGe regions are shown with vertical lines and metallisation layers with strong oblique lines.

A first embodiment of a method of manufacturing a semiconductor device according to the invention will now be described with reference to FIGS. 1 to 9.

Firstly, a silicon semiconductor substrate 10 with a thin buried epilayer of SiGe 12 and an upper silicon epilayer 14 is provided (FIG. 1). Since, in the finished device the components such as transistors are formed in the upper layer 14, this will be referred to as the device layer 14. In the embodiment, the SiGe layer 12 contains 25% Ge and is 20 nm thick, and the upper Si layer 14 is 300 nm thick. In alternative embodiments any suitable materials and thicknesses are possible, for example a buried layer 10 nm to 100 nm thick and an upper device layer 100 nm to 10 µm thick.

Figure 2:
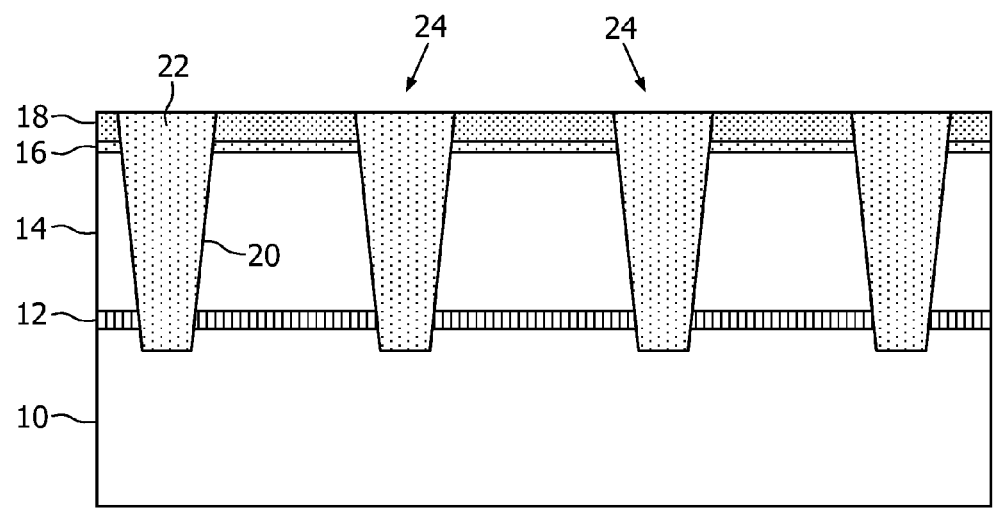

As illustrated in FIG. 2, a pair of insulating layers including a thin oxide layer 16 (10 nm thick) and a nitride layer 18 (80 nm thick) are formed over the epilayer, together with isolation trenches 20 filled with oxide 22 forming Shallow Trench Isolation (STI) structures 24. In this embodiment the isolation trenches 20 extend through the full thickness of the device layer 14 and the buried layer 12. Such a step is relatively standard and accordingly will not be described further. Again, any suitable layer thicknesses are possible, for example an oxide layer 5 nm to 100 nm thick and a nitride layer 10 nm to 500 nm thick. Indeed, in alternative embodiments only one insulating layer is used.

Figure 3:
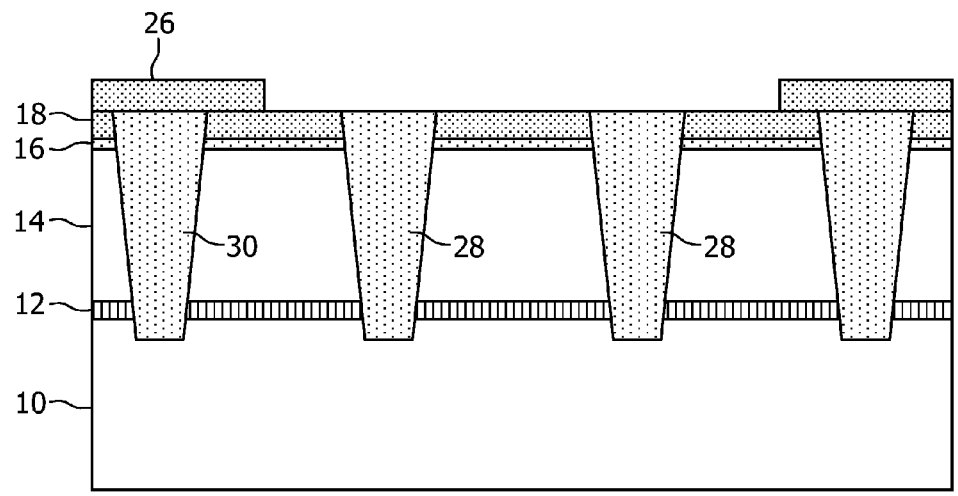

In a conventional STI process, the next step would be to remove the nitride layer 18. In the present embodiment, however, a masking layer in the form of a further nitride layer 26 is deposited to a thickness of 20 nm to 1000 nm, in the example 100 nm. A mask is deposited, and the further nitride layer 26 patterned to expose some of the shallow trenches but not others, as illustrated in FIG. 3. The STI structures 24 that are exposed will be referred to as the exposed trench regions 28 in the following and the masked STI structures will be referred to as masked trench regions 30.

It should be noted that FIG. 3 is highly schematic and in practical embodiments the masked trench regions 30 will be present at different positions along the length of trenches 20 as will be described below with reference to FIGS. 8 to 11. The drawings of FIGS. 3 to 7 and 12 to 18 have been adopted since they conveniently represent both exposed trench regions 28 and masked trench regions 30 in single drawings.

The skilled person will realise that in alternative embodiments the further nitride layer 26 can be replaced with another masking layer 26 such as a layer of photoresist.

The shape of the mask used will be described later.

Next, an oxide etch is used to remove the oxide 22 from the exposed trench regions 28 leaving empty trenches, whilst leaving the oxide 22 present in the masked trench regions 30.

Figure 4:
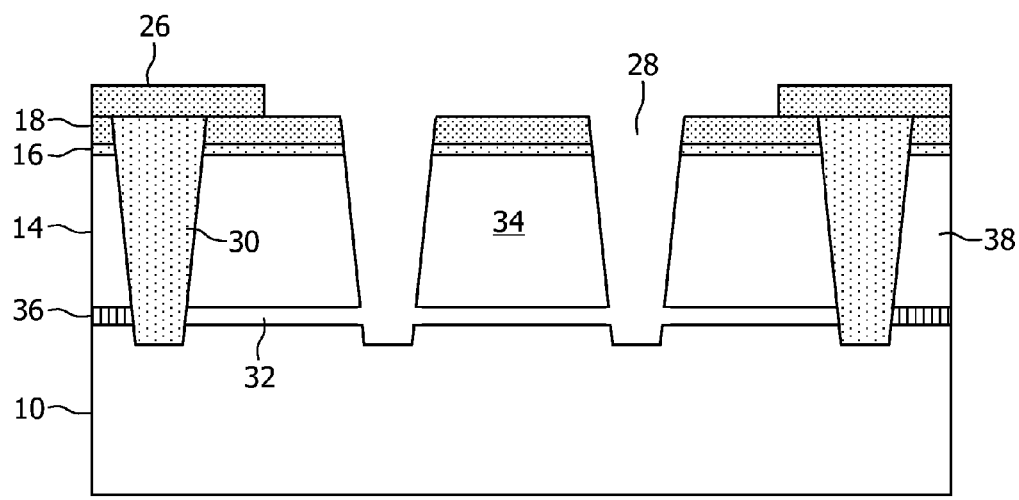

A selective SiGe etch is then used to etch away the buried layer 12 where it is adjacent to an exposed trench isolation structures leaving a cavity 32, as illustrated in FIG. 4. The nitride layer 26 acts as a hard mask.

Note that the cavity 32 completely underetches a central region 34 of the device layer 14 that will become an isolated active device region 34. This region 34 is supported above cavity 32 by masked trench regions 30 as will be described later. Further, note that the masked trench isolation structures 30 block the SiGe etch from etching remaining SiGe regions 36 under a substrate connected region 38 of the upper silicon epilayer 14.

Figure 5:
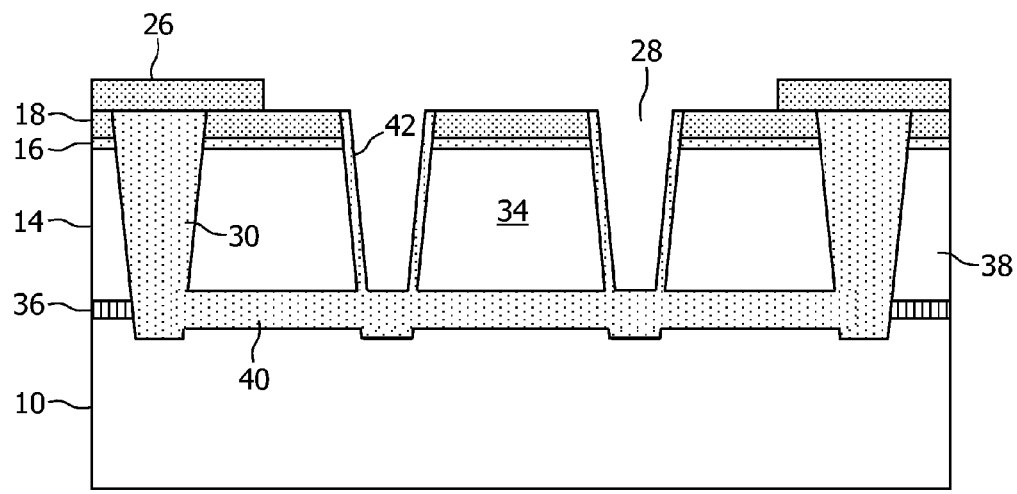

Oxidation is then carried out to fill cavity 32 to form oxide fill 40 in the cavity which will be referred to as a local buried oxide layer 40 and oxide sidewalls 42 on the sidewalls of the trenches of the exposed trench isolation structures 28, as illustrated in FIG. 5.

Figure 6:
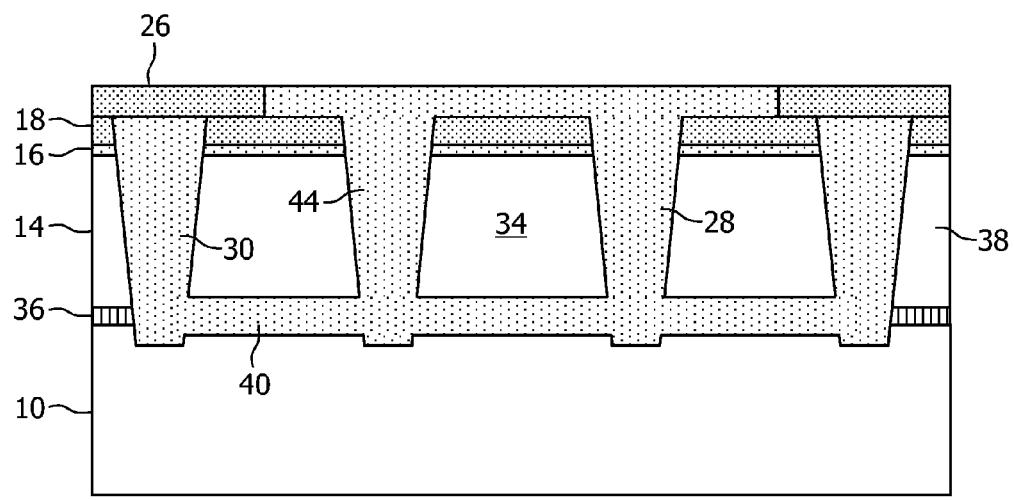

Next, a high density plasma deposition process is used to fill the trenches with filler oxide 44, followed by a planarization process resulting in the structure illustrated in FIG. 6.

Figure 7:
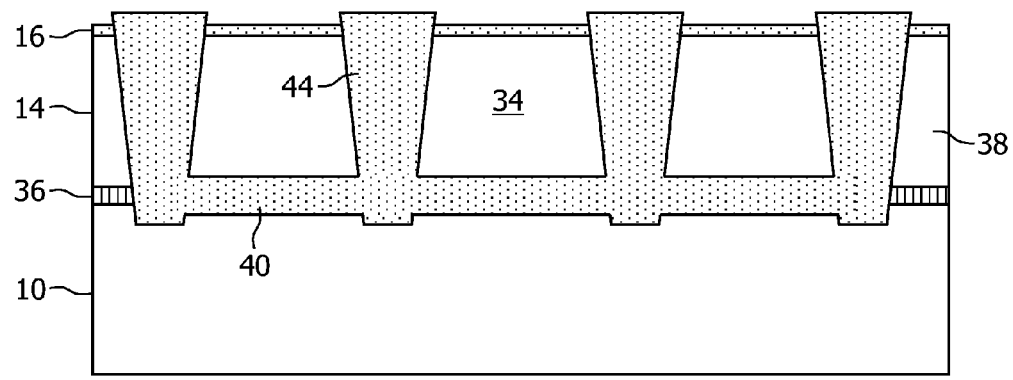

An etch back or chemical mechanical polishing process is then used to remove the nitride layer 26 and the upper part of the filler oxide 44, followed by nitride removal to remove nitride layer 18 to arrive at the structure shown in FIG. 7. The structure has isolated regions 34 which are wholly isolated by the local buried oxide layer 40 and the oxide 44 in the filled trenches. The buried oxide layer 40 is referred to as local since it only isolates some parts of the layer 14. The structure also has substrate connected regions 38 which are connected to the substrate through the remaining SiGe regions 36.

The design of the mask referred to above to carry out the patterning of nitride layer 26 is important. Since the mask ultimately defines the regions where the local buried oxide (LOBOX) layer is formed it will be referred to as the LOBOX mask 50. The LOBOX mask needs to be patterned to ensure that the isolated active regions 34 remain supported even in the step illustrated in FIG. 4 after complete underetching of these regions.

Figure 8:
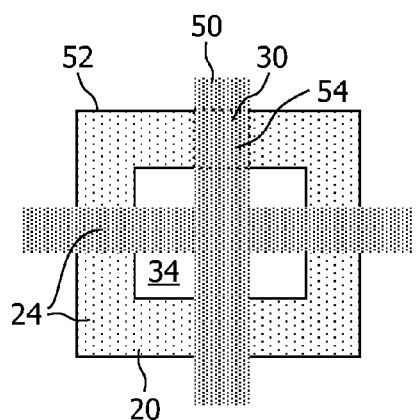
FIGS. 8 and 9 illustrate a top view of two steps of the method of FIGS. 1 to 7.

One suitable mask shape is illustrated in FIG. 8, which shows a top view of mask 50 above an STI trench structure 24 that wholly surrounds and isolates active region 34 from surrounding region 52. The mask is in the shape of a cross that extends from the active region 34 over the STI trench 24 into the surrounding region. Masking regions 54 of mask 50 extend over the STI trench 24, defining masked regions 30.

Figure 9:
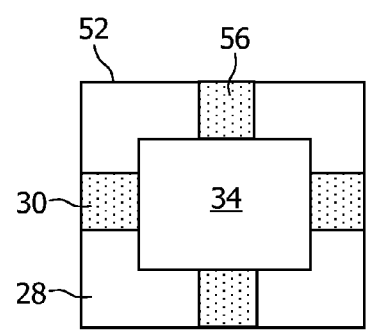

After etching away the oxide in the exposed trenches 28 as illustrated above in FIG. 3, the mask results in the structure of FIG. 9 with trench regions 28 surrounding active region 34. The exposed trench regions 28 are empty except for support oxide structures 56 in the masked regions 30 and hence are not etched away during the etching step removing oxide from the exposed trenches 29. It will be noted that in this embodiment this etching step is an anisotropic etching step to ensure that the support structures 56 remain.

In the SiGe etch step, the etch wholly underetches region 34 which remains supported by support structures 56.

Thus, the method allows complete dielectric isolation of active regions 34 which allows the region 34 to be used for high voltage or power components. However, other regions 38 remain in contact with the substrate 10 and these can be used for conventional logic and control circuitry, which can accordingly be fabricated in a standard manner.

Figure 10:
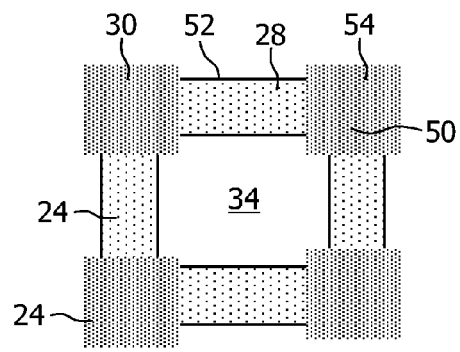
FIGS. 10 and 11 illustrate a top view of a variation of the method of FIGS. 1 to 7.
Figure 11:
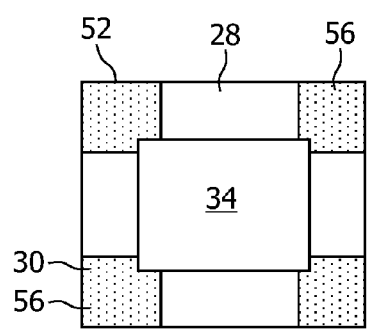

An alternative mask shape 58 is illustrated in FIG. 10. This mask provides a masking region 54 extending from surrounding region 52 over STI trench structure 24 as far as the active region 34 in each corner of the active region. This defines corresponding masked regions 30 of the trench. As illustrated in FIG. 11, after the mask is used to remove the oxide from the STI trench this results in a support structure 56 in exposed trench 28 at each corner of active region 34.

Other mask shapes may also be used, and the number of masking regions 58 and hence masked regions 30 and corresponding support structures 54 is not limited to four. For example, a mask having six masking regions over STI trench structure 24 may be used, none or only some of the regions being at the corners of the active region 34. Other non-rectangular shapes of active region are also possible, which may require different mask patterns and hence different patterns of support structures.

Figure 12:
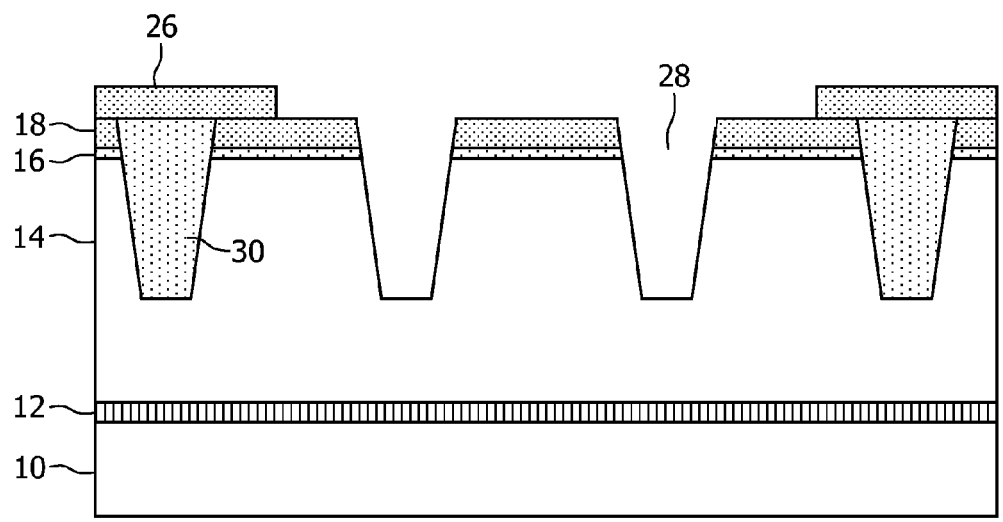
FIGS. 12 to 14 illustrate side views of a second method according to another embodiment of the invention.
Figure 13:
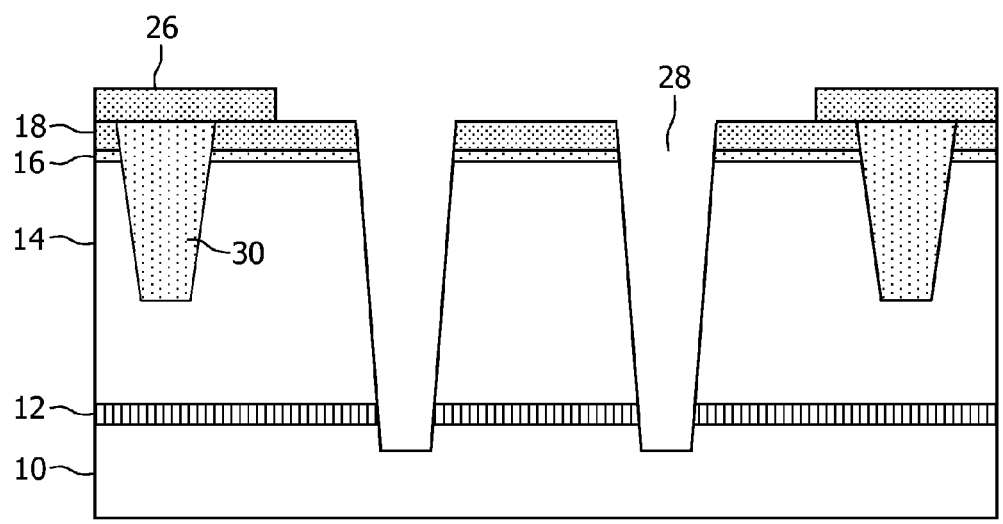
Figure 14:
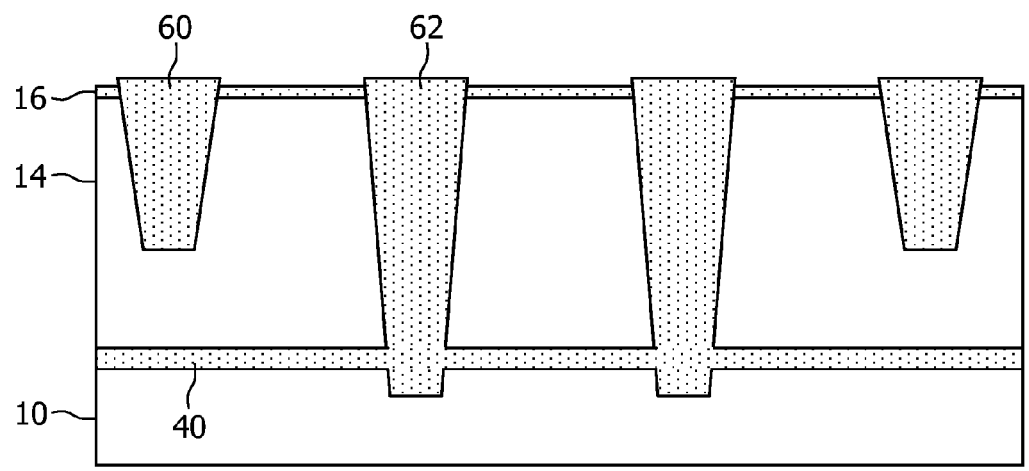
Figure 15:
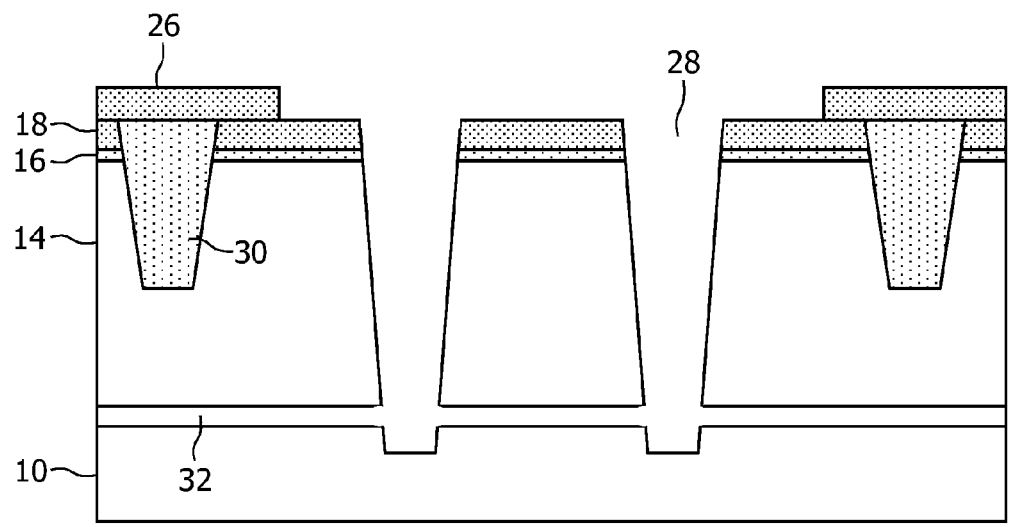
FIGS. 15 to 18 illustrate side views of a third method according to another embodiment of the invention.

FIGS. 12 to 14 illustrate an alternative embodiment. The processing continues as in the method described above up to the step illustrated in FIG. 3, with one difference—this embodiment uses a deeper buried layer. In the method of FIGS. 12 to 14, the trench isolation structures and hence the exposed trench regions 28 do not extend to the depth of the SiGe layer 12, as illustrated in FIG. 12.

Next, as illustrated in FIG. 13, the exposed trench regions 28 are etched using an anisotropic etch to deepen these trenches so that they reach the buried SiGe layer 12. Processing continues as described above with reference to FIGS. 4 to 7 to arrive at the structure of FIG. 14.

The resulting structure has a buried oxide layer 40 and both shallow trench isolation structures 60 and deep trench isolation structures 62. The former correspond to the masked trench regions 30 (FIG. 13) and the latter to the exposed trench regions 28. Thus, this approach allows both shallow and deep trenches to be formed, the depths of which may be controlled independently to optimise high voltage performance.

A further refinement is illustrated in FIGS. 15 to 18, which allows control of the thickness of the LOBOX layer 40. The refinement will be described with reference to an arrangement with both shallow and deep trenches, as in the arrangement of FIGS. 12 to 14, but the refinement is equally applicable to the arrangement of FIGS. 1 to 7.

Figure 16:
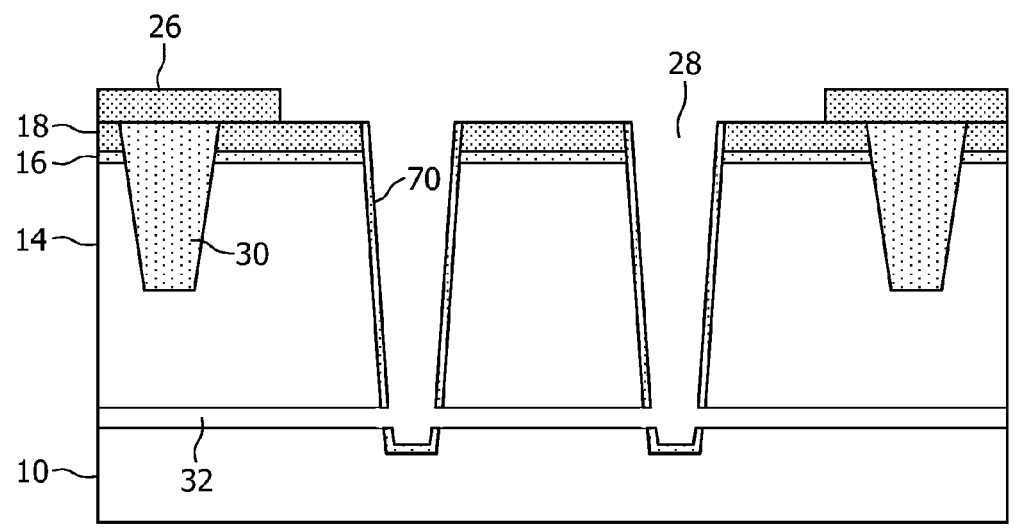

In this approach, after etching away the buried layer 12 (FIG. 15), a thin oxide layer 70 is deposited on the sidewalls of the exposed trenches 28, to a thickness preferably of 5 to 20 nm, in the example 10 nm (FIG. 16). The deposition process used is selected to have a poor step coverage, for example high density plasma (HDP) deposition or plasma enhanced chemical vapour deposition (CVD) oxide.

Figure 17:
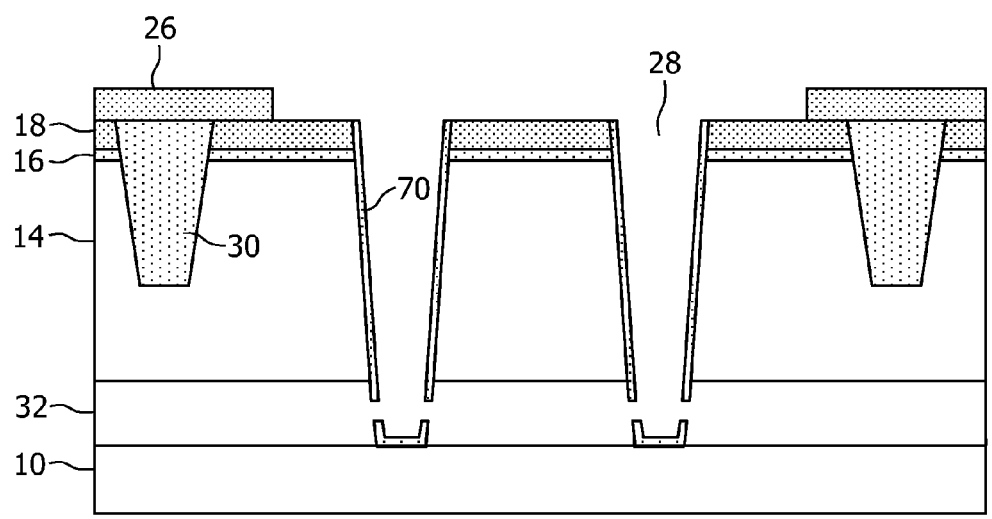

Next, an isotropic silicon etch selective over oxide is used to enlarge the thickness of cavity 32 (FIG. 17). The thin oxide layer 70 protects the sidewalls of the exposed trench regions 28.

Figure 18:
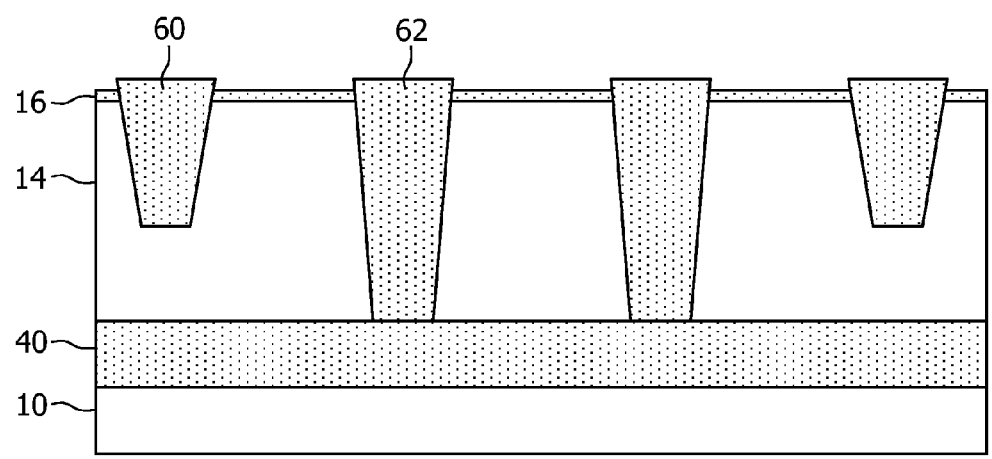

Processing then continues as in earlier embodiments to result in the structure of FIG. 18. The thickness of the LOBOX layer 40 can be controlled by adjusting the amount of etching in the step of FIG. 17.

In a further variation which may be combined with any of the above embodiments, the material used to refill the exposed trench regions 28 is not HDP oxide, but instead a higher dielectric constant (k) material is used. This can improve the voltage handling capability of a device subsequently formed in the isolated active region. Thus, the properties of a high voltage device formed in the isolated active region can be improved without affecting devices formed elsewhere.

After forming the structures as described above, processing can continue to form devices. An example high voltage device that can be manufactured in active region 34 will be described with reference to FIGS. 19 and 20.

The device uses both shallow 60 and deep 62 trench isolation structures, and so it may be manufactured as described above with reference to FIGS. 12 to 14. By also controlling the thickness of the LOBOX layer 40 as described above with reference to FIGS. 15 to 18, the device can be optimised.

A p-type body region 80 is formed in part of the active region 34, for example by a p-implantation. The remainder of the active region forms n-type drain region 82. An n+ type source contact 84 is provided in the p-type body region, as well as a p+ type body contact 86 on the opposite side of the source contact 84 to the drain region 82. A n+ type drain contact 88 contacts drain region 82, on the opposite side of the drain to the body region 80 and spaced from the body region 80 by the shallow trench isolation structure 60.

Gate insulator 90 extends from the source contact 84 over body 80 and part of the drain region 82, and a gate 92 is provided over the gate insulator 90. A source metallisation 94 contacts the source and body contacts 84, 86 and a drain metallisation 96 contacts the drain contact 88. The gate and metallisation may be made of any suitable conductor, including metal, polysilicon, alloys, or any other conductive material.

Note that a STI structure 60 forms a field plated structure intended to enhance the properties of the transistors by using the voltage applied to the gate. The STI structure extends within the drain region 82, spaced from the body region 82, as illustrated in top view in FIG. 20.

In the example shown the gate 92 extends over the STI structures 60.

The device is a high voltage device completely isolated by the deep isolation structures 62 and the LOBOX layer 40.

Note that other regions of the semiconductor device (not shown in FIGS. 19 and 20) may include a buried semiconductor layer and a substrate connected device region.

Figure 19:
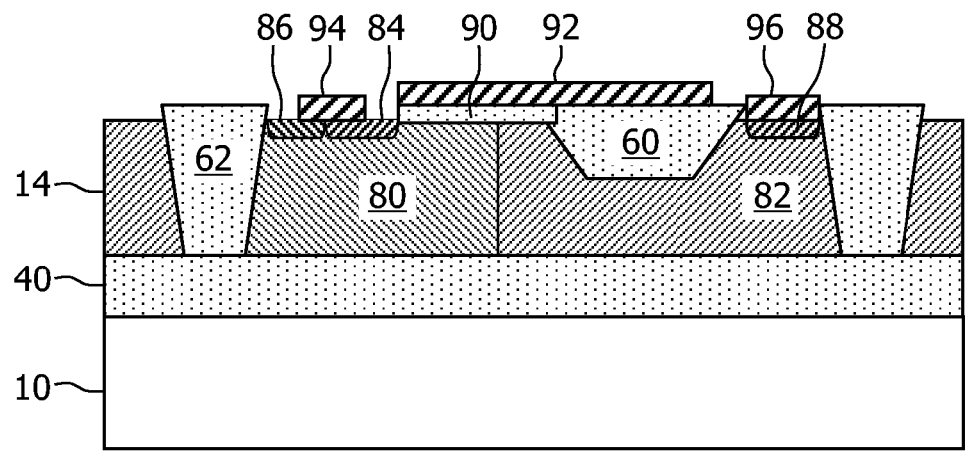
FIGS. 19 and 20 illustrates a high voltage component that may be fabricated in part of a device in accordance with an embodiment of the invention.
Figure 20:
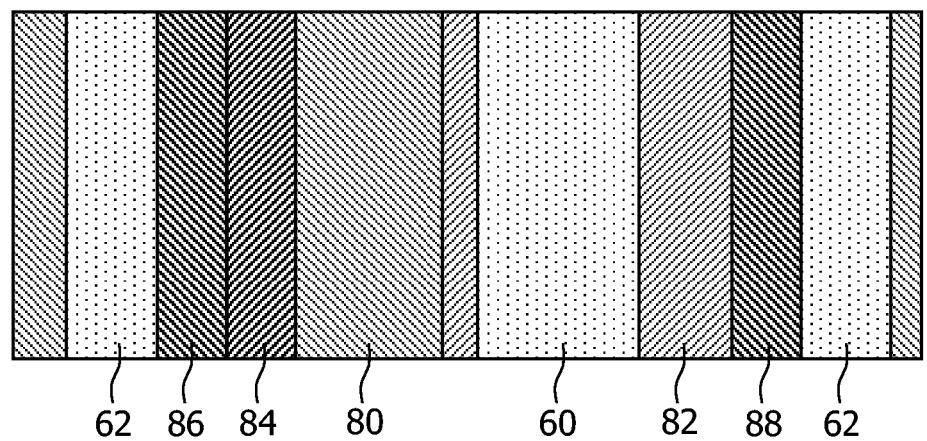

Although the structure illustrated in FIGS. 19 and 20 is a single sided structure it is also possible to form a double sided structure with a central drain extending laterally and two source contacts also extending laterally but longitudinally spaced from the central drain, one on each side of the drain.

Those skilled in the art will be familiar with many other alternative device structures that may also be formed.

Figure 21:
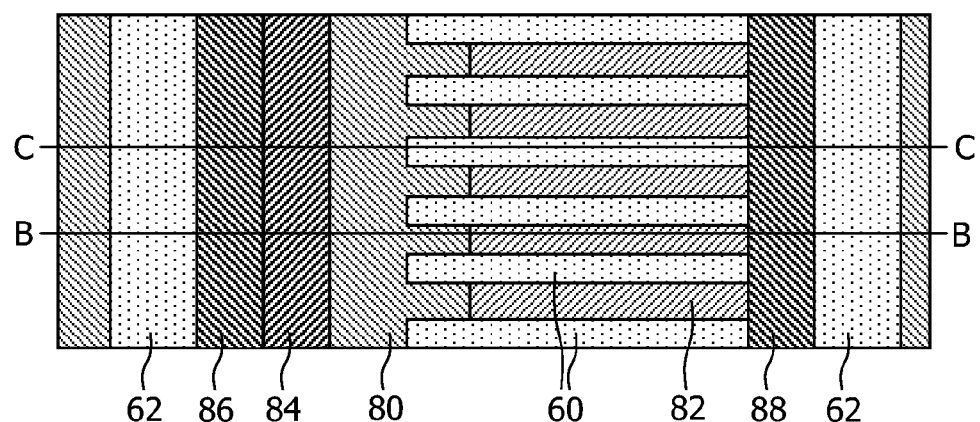
FIGS. 21 to 23 illustrate an alternative high voltage component that may be fabricated in part of a device in accordance with an embodiment of the invention.
Figure 22:
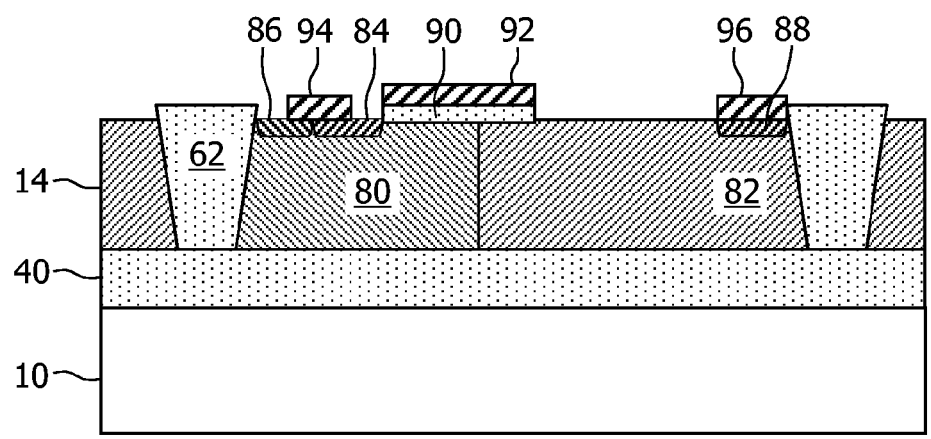
Figure 23:
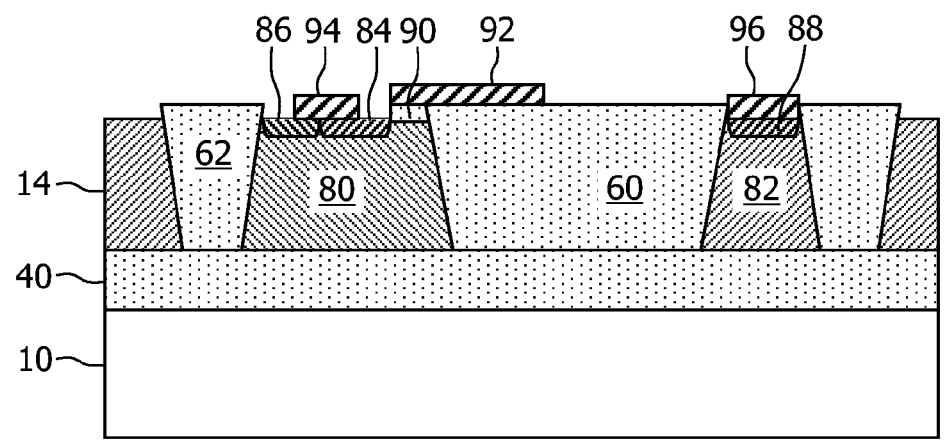

FIGS. 21 to 23 illustrates a modification of the structure of FIGS. 19 and 20 to generate a dielectric RESURF structure. FIG. 21 shows a top view and FIGS. 22 and 23 views along the lines B-B and C-C in FIG. 21 respectively. The structure differs from that of FIGS. 19 and 20 in that the STI trench structure 60 extends vertically as far as LOBOX layer 40. In this case the STI structure functions as a dielectric RESURF structure. Further, the STI structures (FIG. 23) alternate laterally with regions without the trench (FIG. 22)—this can be seen most easily in FIG. 21. The STI structures extend from fully within the body region 80 to the drain contact 88.

Note that in this arrangement the gate electrode 92 is not shown as extending over the STI trench structures 60 though it optionally can as in the arrangement of FIGS. 19 and 20.

Figure 24:
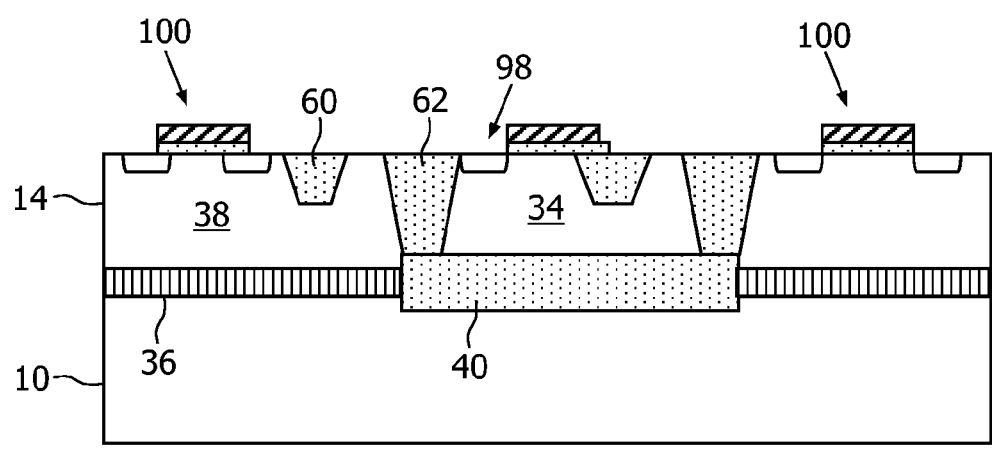
FIG. 24 illustrates an embodiment of an integrated circuit device according to the invention.

FIG. 24 illustrates a complete device with substrate 10, LOBOX layer 40 and deep trench isolation structures 62 defining isolated active region 34 with high voltage device 98 as described above in FIGS. 19 and 20. A number of low voltage transistors 100 are provided outside the isolated active region 34 in substrate-connected active region 38. The remaining SiGe layer 36 may be seen. These devices are made by a conventional CMOS process in the device layer 14.

Thus, this approach allows some devices to be isolated and some to be substrate connected allowing greater possibilities for integrating multiple different devices, for example power devices and logic circuits.

The above embodiments partially fill the trench 20 by providing masked regions 30 at positions along the length of the trench. A number of embodiments use an alternative which is to partially fill the trench using deposits on the sidewalls, as will now be described with reference to FIGS. 25 to 36.

Figure 25:
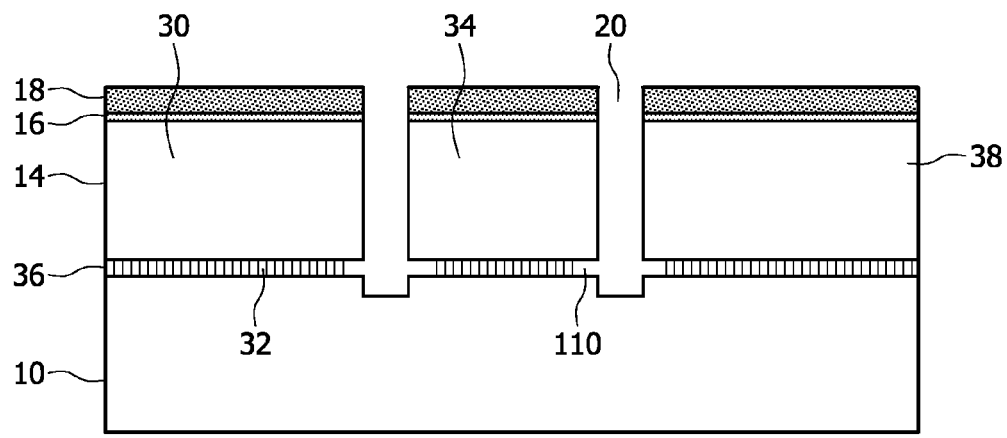
FIGS. 25 to 27 illustrate side views of a fourth method according to another embodiment of to the invention.
Figure 26:
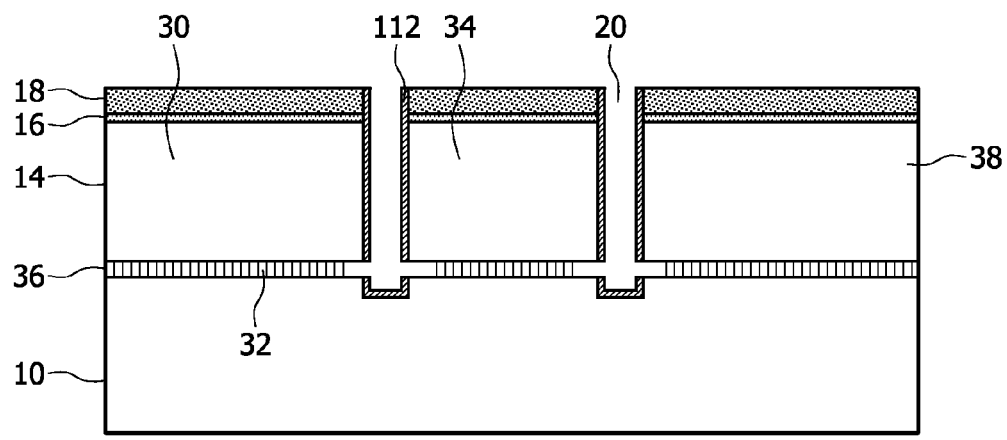

Referring to FIGS. 25 and 26, in this approach, an access trench 20 is formed through the upper insulating layers 18,16, the device layer 14 and the SiGe layer 12 into substrate 10. Then, a small amount of further etching is carried out to selectively etch away small regions of the SiGe layer 12 adjacent to the access trench 20, leaving small notches 110 in the SiGe layer adjacent to the access trench, as illustrated in FIG. 25.

Then, a protective dielectric layer 112 is deposited using a method with poor step coverage as illustrated in FIG. 26, covering the sidewalls with sidewall dielectric layer 114 and also the top with top dielectric layer 116. This leaves the notch 110 as the only unprotected layer to etch away.

Thus, in this case the SiGe layer is not fully etched in a single step.

Uses of this approach will be described in more detail below. However, in general terms, this approach can achieve sufficient selectivity between the etch of the (SiGe) layer and the surrounding materials. The approach can also achieve greater selectivity between the etch of the SiGe layer and the hard mask of dielectric layers 18,16. Further, smooth sidewalls in the trenches 20 can result.

Whilst all of these goals are achievable without the approach of FIGS. 25 and 26, the use of the protective dielectric layer 112 makes it possible to carry out such etching of the SiGe layer using conventional tools, and in particular without needing the same precise control of the etching parameters as are required without the use of this protective layer 112. In particular, etch selectivity becomes much less critical so the precise etch parameters also become less critical. Thus, using the approach of FIGS. 25 and 26 saves cost.

Figure 27:
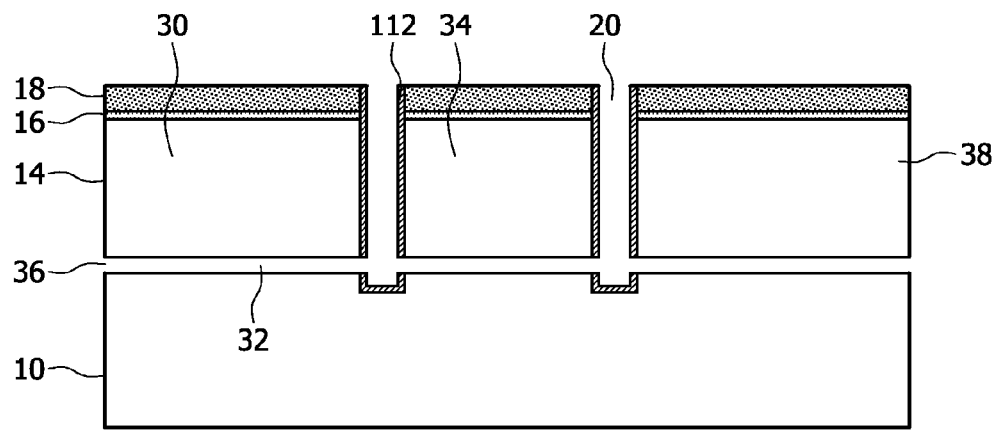

FIG. 27 illustrates a first way of using the protective layer 112 in which the SiGe layer is simply etched away to define cavities 32 after the step of FIG. 26 as illustrated in FIG. 27, using the protective layer 112 as a hard mask. This allows improved formation, particularly where very long horizontal cavities 32 are required, and such long cavities can be formed without unwanted deepening of access trenches 20 and without attacking the sidewalls of the access trenches which are protected by the protective layer 112.

Figure 28:
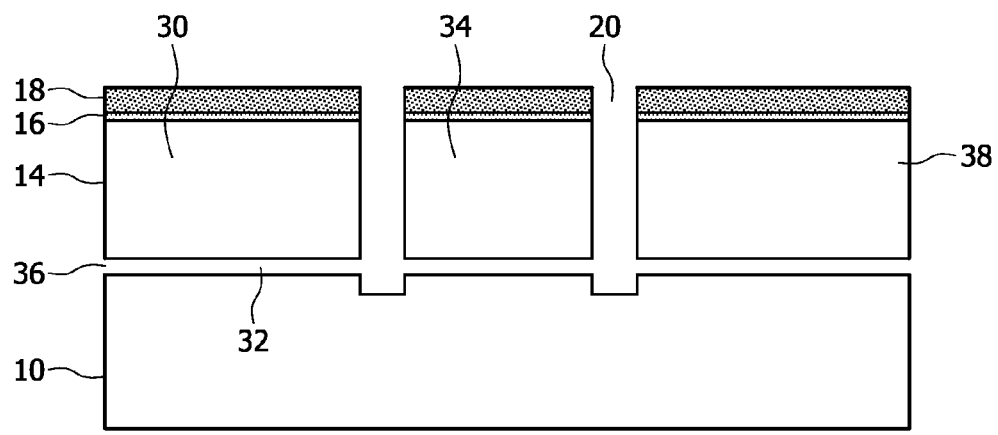
FIG. 28 illustrates a side view of a fifth method according to another embodiment of the invention.

Note that it is possible as an alternative to continue the etch until the protective layer 112 is itself etched away, as illustrated in FIG. 28.

Figure 29:
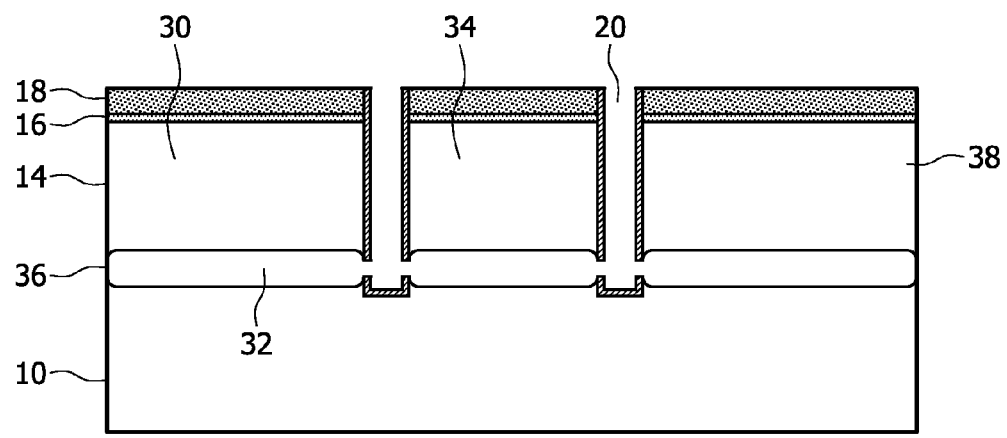
FIG. 29 illustrates a side view of a sixth method according to another embodiment of the invention.

If a thicker cavity is required, a further isotropic Si etch may be carried out after the step of FIG. 27 leaving the arrangement of FIG. 29 with thicker cavity 32. A similar approach may be carried out after the step of FIG. 28. The cavity 32 can be filled with insulator (not shown), as described above with reference to FIGS. 5 to 7.

FIGS. 30 to 35 illustrate an alternative approach. In this approach, the SiGe buried layer 12 is not formed across the whole surface of the substrate but is patterned. This may be achieved, for example, by forming a mask material layer over an Si substrate 10 where SiGe is not required, depositing the SiGe layer 32 over the whole substrate 10, including over the mask where present, removing the mask and any SiGe on top of the mask, and then continuing by forming epitaxial layer 14, body layer 16 and source layer 18.

Figure 30:
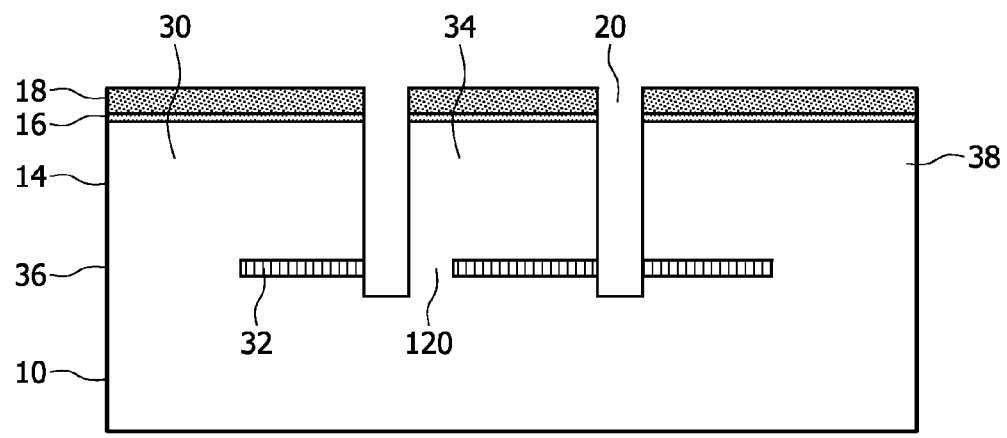
FIGS. 30 to 36 illustrate in top and side views a seventh method according to an embodiment of the invention.
Figure 31:
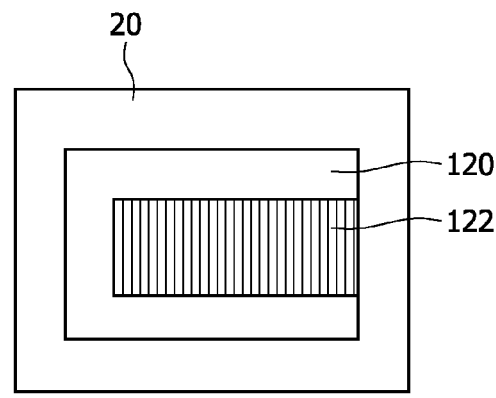

Thus, after access trenches 20 are formed, the device structure is as shown in FIG. 30 in which the SiGe buried layer 12 is missing from support regions 120 of silicon. FIG. 31 shows this structure in top view, where it can be seen that the access trench 20 surrounds the SiGe region 122 with support region 120 surrounding the SiGe region on three sides leaving SiGe region exposed at the trench on one side.

Figure 32:
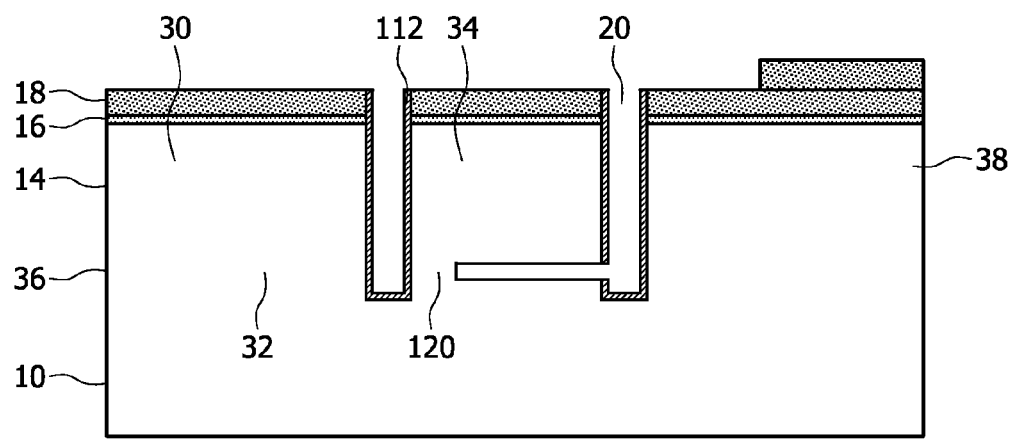

Next, as illustrated in FIG. 32, protective layer 112 is deposited using a process with poor step coverage as above. A short silicon isotropic etch is then carried out, leaving the structure illustrated in FIG. 33 (side view) and in FIG. 34 (top view) in which cavity 32 does not extend the full width under central region 34. The figures clearly show the remaining support region 120 and protective layer 122.

Figure 35:
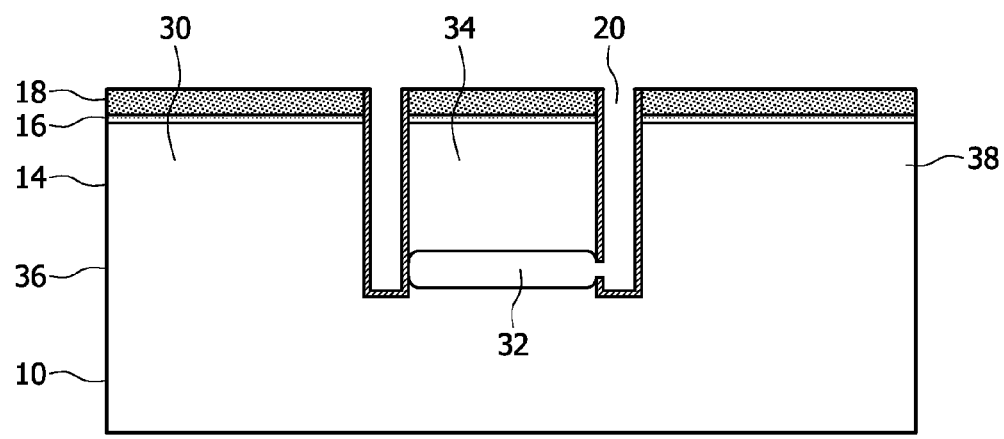
Figure 36:
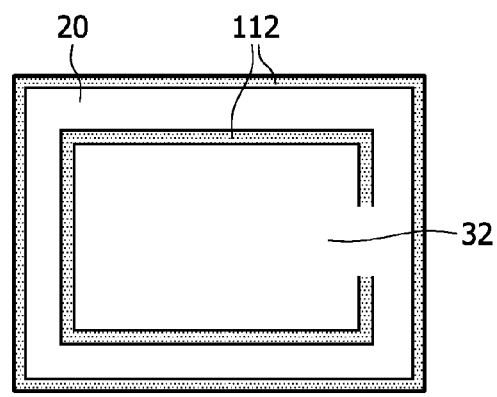

A further release etch is then carried out to release the central region 34 by fully underetching it as illustrated in FIG. 35 (side view) and FIG. 36 (Top View). In this state the central region 34 is supported by protective layer 112 acting here as a support layer.

Thus, the protective layer is only used to support the central region 34 during the final release etch and this allows larger free standing structures to be realised. The release etch can be a simple isotropic and non-selective etch which does not require complex parameters and accordingly can be optimised to avoid disturbing the central region 34 during the etch. The final release etch can also be carried out at a later stage of processing after further support, for example from metallisations and the like, has been provided to the central region 34.

Figure 33:
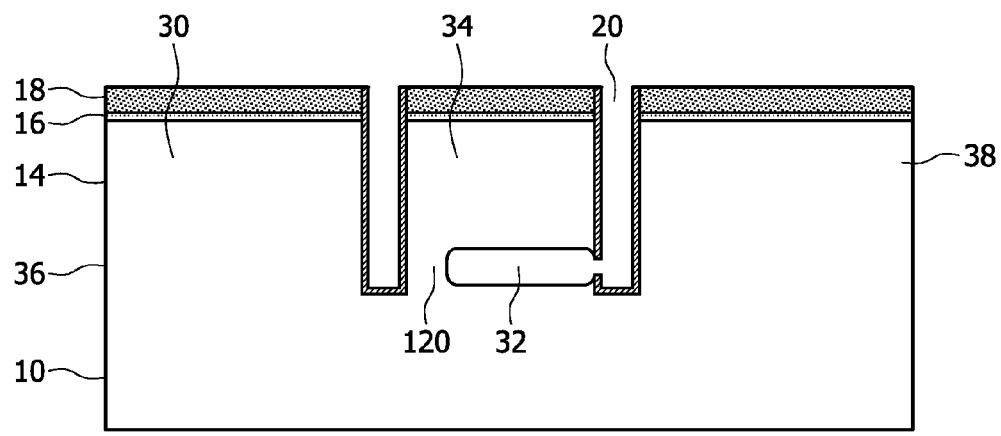
Figure 34:
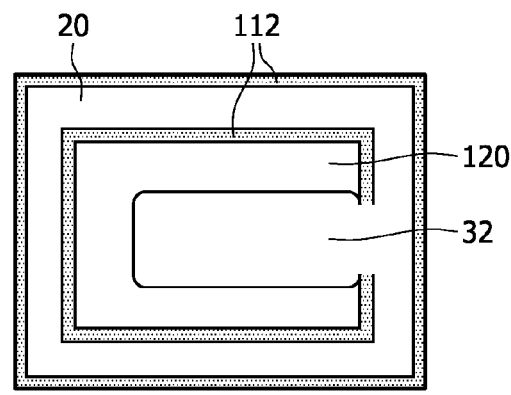

Note that although the above description describes a short silicon etch to arrive at the structure of FIGS. 33 and 34 followed by a release etch to arrive at the structure of FIGS. 35 and 36 embodiments may use a single etch to carry out both steps.

Note also that the arrangement of FIGS. 30 to 36 does not require the masked regions 30.

The embodiments above are provided purely by way of example and those skilled in the art will realise that many variations are possible.

In particular, in particularly preferred embodiments both mask support structures 56 and dielectric 112 on the trench sidewalls are used to support active region 34.

The type of transistors and devices formed is not limited in any way.

For example, it is not necessary to use Si for the device layer and the substrate and SiGe for the buried layer. In one alternative, SiGe can be used for the buried layer and Si for the device layer. Indeed, any semiconductors may be used, as long as a suitable selective etch for the material of the buried layer is available.

If the cavity is not filled, a Silicon on Nothing structure can be fabricated.

The various mask shapes used can also be varied.

The method is not only suitable for high power or high voltage applications but can be used wherever device isolation is desired or required.

Although the above description describes multiple separate exposed trench isolation structures and masked trench isolation structures, it is possible to provide one or more linked exposed trench isolation structures or one or more linked masked trench isolation structures. The linked structures may be considered as a single exposed or masked trench isolation structure.

The present invention extends to all such variations that fall within the scope of the present invention as defined in the accompanying claims.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

The invention claimed is:

1. A semiconductor device, comprising:
   a semiconductor substrate;
   a buried insulating layer over a part of the semiconductor substrate;
   a buried semiconductor layer of different material to the substrate over the remainder of the semiconductor substrate;
   a device layer over the buried insulating layer and the buried semiconductor layer;
   a plurality of trench isolation structures filled with insulator extending through the full thickness of the device layer to define at least one insulated active device region in the device layer surrounded by a trench isolation structure and above the buried insulating layer, the insulated active device region being insulated from the substrate by the buried insulating layer and the trench isolation structure; and
   at least one substrate-connected device region in the device layer connected to the substrate through the buried semiconductor layer.

2. A semiconductor device according to claim 1 wherein the semiconductor substrate and the device layer are of Si and the buried semiconductor layer is of SiGe.

3. A semiconductor device comprising:
   a substrate of a first semiconductor material;
   a buried layer of a second semiconductor material on the substrate;
   a device layer of a third semiconductor material on the second semiconductor material, wherein at least one active region is partially present in the device layer and over the buried layer;
   trenches that extend at least partially through the device layer;
   a plurality of trench isolation regions spaced laterally across the device layer and configured and arranged on sides of at least one isolated active region, the trench isolation regions including at least one trench at least partially filled with support insulator, and including at least one other trench that is lined with support insulator that defines an etched pathway which leads to and exposes at least part of the buried layer; and
   wherein the buried layer has been selectively etched through the part of the trench not including the support insulator to remove the buried layer from under at least one isolated active region of the device layer leaving the support insulator for acting as a support structure to support the isolated active region; and
   wherein at least one of the plurality of trench isolation regions protects the buried layer under the at least one isolated active region of the device layer forming a substrate connected active region of the device layer.

4. The semiconductor device as recited in claim 3, wherein there is at least one cavity having a plurality of isolation regions above cavities supported only by the at least one support structure.

5. A semiconductor device comprising:
   a substrate of a first semiconductor material;
   a buried layer of a second semiconductor material on the substrate;
   a device layer of a third semiconductor material on the second semiconductor material, wherein at least one active region is at least partially formed in the device layer and over the buried layer;

trenches extending at least partially through the device layer;

a plurality of trench isolation structures spaced laterally across the device layer and configured and arranged on sides of the at least one active region, the trench isolation structures comprising at least one trench including a support insulator, with insulator material partially filling a first region of the at least one trench but with at least part of the buried layer exposed through a second region of the at least one trench, the second region lined with support insulator;

wherein the second region of the at least one trench defines a pathway that leads to and exposes at least part of the buried layer;

wherein the at least one trench and at least one other trench extend through the buried layer, wherein the buried layer has been removed from under the at least one active region of the device layer, thereby leaving the support insulator for acting as a support structure to support the at least one active region, and wherein at least one of the plurality of trench isolation structures protects the buried layer under the at least one active region of the device layer forming a substrate connected active region of the device layer.

6. The semiconductor device as recited in claim 5, further comprising additional insulator material that fills the second region.

7. The semiconductor device as recited in 5, wherein there is at least one power semiconductor component in the at least one active region and at least one control or logic semiconductor component in the substrate-connected active region.

8. The semiconductor device as recited in claim 5, wherein the first and third semiconductor materials are the same.

9. The semiconductor device as recited in claim 5, where the first and third semiconductor materials are silicon and the second semiconductor material is silicon germanium.

10. The semiconductor device as recited in claim 5, further comprising additional insulator material that fills a region under the at least one active region where the buried layer was removed.

* * * * *